(12) United States Patent
Kim

(10) Patent No.: US 9,412,665 B2
(45) Date of Patent: Aug. 9, 2016

(54) SEMICONDUCTOR DEVICE AND METHOD OF FABRICATING THE SAME

(71) Applicant: SK hynix Inc., Icheon (KR)

(72) Inventor: Sung Soo Kim, Suwon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/731,331

(22) Filed: Jun. 4, 2015

(65) Prior Publication Data
US 2015/0270362 A1   Sep. 24, 2015

Related U.S. Application Data

(63) Continuation of application No. 13/719,017, filed on Dec. 18, 2012, now Pat. No. 9,082,848.

(30) Foreign Application Priority Data

Aug. 31, 2012   (KR) .................. 10-2012-0096486

(51) Int. Cl.
| | |
|---|---|
| H01L 21/8234 | (2006.01) |
| H01L 29/78 | (2006.01) |
| H01L 27/108 | (2006.01) |
| H01L 29/423 | (2006.01) |
| H01L 29/51 | (2006.01) |
| H01L 21/283 | (2006.01) |
| H01L 21/306 | (2006.01) |
| H01L 21/3205 | (2006.01) |
| H01L 21/3213 | (2006.01) |
| H01L 29/49 | (2006.01) |
| H01L 29/66 | (2006.01) |

(52) U.S. Cl.
CPC ...... *H01L 21/823437* (2013.01); *H01L 21/283* (2013.01); *H01L 21/30604* (2013.01); *H01L 21/32051* (2013.01); *H01L 21/32133* (2013.01); *H01L 21/8234* (2013.01); *H01L 27/10876* (2013.01); *H01L 29/4236* (2013.01); *H01L 29/42364* (2013.01); *H01L 29/4958* (2013.01); *H01L 29/517* (2013.01); *H01L 29/518* (2013.01); *H01L 29/6653* (2013.01); *H01L 29/78* (2013.01); *H01L 29/7813* (2013.01); *H01L 29/7831* (2013.01)

(58) Field of Classification Search
CPC ..................... H01L 29/42312; H01L 29/4232; H01L 29/42328; H01L 29/42336; H01L 29/42356; H01L 29/4236; H01L 29/42376; H01L 29/66704; H01L 29/66734; H01L 29/7397; H01L 29/7813; H01L 29/7825; H01L 21/8232; H01L 21/8234; H01L 21/823437; H01L 21/823493; H01L 21/823885
See application file for complete search history.

(56) References Cited

U.S. PATENT DOCUMENTS

| | | | | |
|---|---|---|---|---|
| 5,468,663 A | * | 11/1995 | Bertin et al. .................. | 438/259 |
| 2008/0023754 A1 | | 1/2008 | Baek | |
| 2013/0164919 A1 | * | 6/2013 | Park et al. ..................... | 438/478 |

FOREIGN PATENT DOCUMENTS

| | | |
|---|---|---|
| KR | 10-0876778 B1 | 1/2009 |
| KR | 10-0906643 B1 | 7/2009 |

*Primary Examiner* — Eduardo A Rodela

(57) ABSTRACT

A semiconductor device and a method for manufacturing the same are capable of improving GIDL in a buried gate, and preventing degradation of device characteristics and reliability due to reduction in gate resistance. The semiconductor device may include: junction regions formed at both sidewalls of a trench formed in a semiconductor substrate; a first gate electrode formed in a lower portion of the trench; a second gate electrode formed on at least one inner sidewall of the trench which overlaps one of the junction regions on the first gate electrode; and a third gate electrode formed on one side of the second gate electrode on the first gate electrode.

14 Claims, 10 Drawing Sheets

SEMICONDUCTOR DEVICE AND METHOD OF FABRICATING THE SAME

CROSS-REFERENCE TO RELATED APPLICATION

The present application is a continuation of U.S. patent application Ser. No. 13/719,017 filed on Dec. 18, 2012, which claims priority to Korean patent application number 10-2012-0096486, filed on 31 Aug. 2012, which are incorporated by reference herein in their entireties.

BACKGROUND

1. Technical Field

The inventive concept relates to a semiconductor device and a method of fabricating the same, and more particularly, to technology to improve gate-induced drain leakage (GIDL) of a buried gate and to improve device characteristic and reliability with reduction in a gate resistance.

2. Related Art

In recent years, although demands on large capacity of dynamic random access memories (DRAMs) have been increasing, there is a limit to increase in the capacity of the DRAMs due to increased chip size. With the increase of the chip size, the number of chips per a wafer is reduced and yield of the device is reduced. Therefore, in recent years, there are studies to reduce a cell area through change of a cell layout and thus to integrate as many memory cells as possible on one wafer.

According to this, buried gate structures have been developed. In the buried gate, leakage current due to gate induced drain leakage (GIDL) of a semiconductor device, is increased between a conductive material (gate electrode) and an N type junction of an active region, or between the conductive material and a storage node contact. Refresh time (tREF) of the whole semiconductor device may be reduced due to degradation of GIDL.

To prevent the leakage current from being increased due to GIDL, a conductive material (gate electrode) of the buried gate is overetched to minimize an overlapping area between the storage node contact and the conductive material (gate electrode).

However, although the conductive material (gate electrode) of the buried gate is over etched to prevent the leakage current from being increased due to GIDL, resistance of the buried gate may be increased to degrade operation speed, current drivability, and a write-recovery time (tWR) in the semiconductor device.

SUMMARY

One or more exemplary embodiments are provided to a semiconductor device capable of improving GIDL in a buried gate, and preventing degradation of device characteristics and reliability due to reduction in gate resistance. Methods of fabrication are also disclosed.

According to one aspect of an exemplary embodiment, there is provided a semiconductor device. The semiconductor device may include: a semiconductor substrate having a trench, the trench having first and second side; junction regions formed at the semiconductor substrate deposed in the first and second side of a trench formed; a first gate electrode formed in a lower portion of the trench; a second gate electrode formed over at least one inner sidewall of the trench, which overlaps one of the junction regions, and formed over the first gate electrode; and a third gate electrode formed over one side of the second gate electrode and over the first gate electrode.

The device further includes a barrier layer disposed between the second gate electrode and the third gate electrode. The second gate electrode is formed over both inner sidewalls of the trench. The third gate electrode is formed between the second gate electrodes. The first gate electrode and the third gate electrode include metal and the second gate electrode includes polysilicon.

The second gate electrode is formed over the one inner sidewall of the trench adjacent to a storage node contact. The third gate electrode is formed in the trench at the one side of the second gate electrode over the first gate electrode. The second gate electrode has a height to overlap the junction regions. The semiconductor device further includes a sealing layer formed over the second gate electrode and the third gate electrode.

According to another aspect of an exemplary embodiment, there is provided a method of fabricating a semiconductor device. The method may include: etching a gate region of a semiconductor substrate to form a trench; forming a first gate electrode filling the trench; etching the first gate electrode to a depth in which the first gate electrode is not overlapped with junction regions of the semiconductor substrate; forming a second gate electrode over at least one inner sidewall of the trench and over the first gate electrode; and forming a third gate electrode in the trench over one side of the second gate electrode over the first gate electrode.

The forming the second gate electrode includes forming second gate electrode over the first and second inner sidewalls of the trench adjacent to the junction regions and over the first gate electrode. The forming the second gate electrode includes forming the second gate electrode over the one inner sidewall of the trench adjacent to a storage node contact. The forming the second gate electrode includes forming the second gate electrode to have a height to overlap the junction regions.

The etching the first gate electrode to the depth in which the first gate electrode is not overlapped with the junction regions, includes: etching the first gate electrode to have a height in which an upper surface of the first gate electrode is not overlapped with the junction regions.

The method further includes forming a barrier layer over the one side of the second gate electrode before the forming the third gate electrode. The barrier layer is formed using at least one of titanium (Ti) and titanium nitride (TiN). The method further includes forming a gate insulating layer along a contour of the trench before forming the first gate electrode.

The forming the first gate electrode includes: forming a barrier metal layer over the gate insulating layer in the trench; and depositing a first gate material over the barrier metal layer to form the first gate electrode.

The etching the first gate electrode to the depth in which the first gate electrode is not overlapped with the junction regions, includes: partially etching the first gate electrode and simultaneously partially etching the barrier metal layer.

The first gate electrode and the third gate electrode are formed of a metal material and the second gate electrode is formed of a polysilicon material.

The forming the second gate electrode includes: depositing a second gate material along a contour of the trench; performing spacer-etching on the second gate material to remain over the first and second inner sidewalls of the trench; and etching the second gate material remaining over the both sidewalls of the trench to a fixed height, to form the second gate electrode.

The forming the second gate electrode includes: depositing a second gate material along a contour of the trench; etching the second gate material through spacer-etching to remain over the first and second inner sidewalls of the trench; etching remaining second gate material over the both sidewalls of the trench to a fixed height; forming a photoresist layer covering the second gate material at a storage node contact side; and removing the second gate material formed over another sidewall of the trench and exposed by the photoresist layer.

spacer-etching on the According to the exemplary embodiment of the inventive concept, GIDL is improved and gate resistance is reduced to prevent device characteristics and reliability such as a refresh time tREF from being degraded.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
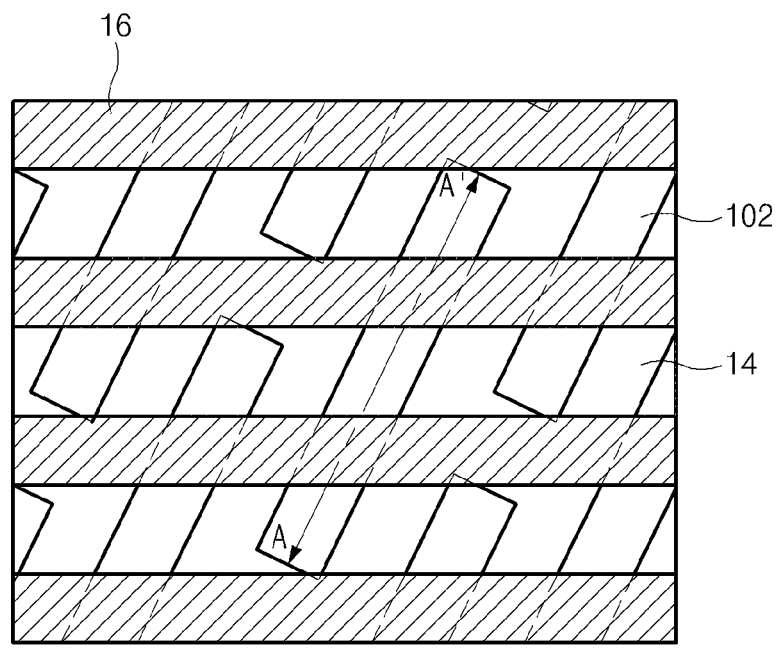
FIG. 1 is a plan view illustrating a 6F$^2$ structure to which a semiconductor device according to exemplary embodiments of the inventive concept is applied.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, may be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Particular embodiments relate to technology in which a buried gate is configured of a first and third gate electrodes using metal and a second gate electrode using N+ polysilicon to improve GIDL and to prevent degradation of device characteristic and reliability due to reduction in a gate resistance, while an overlapping region between a junction region and a gate electrode is deeply formed. The technical principle may be applied to any semiconductor apparatus including a semiconductor device.

Hereinafter, exemplary embodiments will be described with reference to FIGS. 1 to 5E.

FIG. 1 is a plan view illustrating a structure of a semiconductor device according to exemplary embodiments of the inventive concept.

Figure 2:
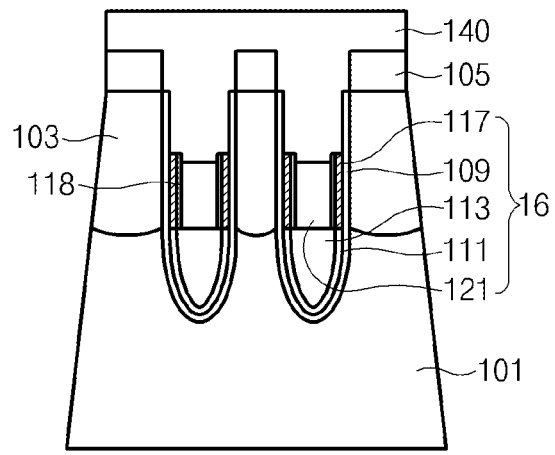
FIG. 2 is a cross-sectional view illustrating a semiconductor device according to a first exemplary embodiment of the inventive concept taken along line A-A' of FIG. 1.

FIG. 1 is a plan view illustrating a 6F$^2$ structure to which a semiconductor device according to an exemplary embodiment is applied. FIG. 2 is a cross-sectional view illustrating a semiconductor device according to a first exemplary embodiment taken along line A-A' of FIG. 1. Referring to FIGS. 1 and 2, a device isolation layer 14 defining an active region 102 is formed in a predetermined region of a semiconductor substrate 101 and a gate 16 has a buried gate structure buried in the active region and the device isolation region 14. The active region 102 is disposed not to orthogonally cross the gate 16, but instead to obliquely cross the gate 16. A gate insulating layer 109 is formed between the gate 16 and the active region 102. The gate insulating layer 109 may comprise a silicon oxide (SiO$_2$) layer or a high dielectric (high-k) layer having a higher dielectric constant than a silicon oxide (SiO$_2$) layer.

As shown in FIG. 2, in the semiconductor device according to the first exemplary embodiment, the buried gate 16 is formed to be buried in the semiconductor substrate 101. The buried gate 16 includes the gate insulating layer 109 and a barrier metal layer 111 sequentially stacked in a trench, a first gate electrode 113 formed on the barrier metal layer 111, second gate electrodes 117 formed on both side walls of the trench on the first gate electrode, and a third gate electrode 121 formed between the second gate electrodes 117.

The first gate electrode 113 has a height not to overlap the junction region 103, and the second gate electrode 117 has a height to overlap the junction region 103. A barrier layer 118 is formed between the second gate electrode 117 and a third gate electrode 121 to minimize a contact resistance between the second gate electrode 117 and the third gate electrode 121. The barrier layer 118 may comprise titanium (Ti), titanium nitride (TiN) and the like.

The first gate electrode 113 and the third gate electrode 121 may comprise a metal material such as tungsten (W). The second gate electrode 117 may comprise N+ polysilicon material.

In the first exemplary embodiment described above, the buried gate 16 has a structure such that the N+ polysilicon gate electrode (second gate electrode) having a work function lower than the first gate electrode 113, is formed on both sidewalls of the trench which are overlapping regions with the junction regions 103. The second gate electrode is not limited to the N+ polysilicon gate electrode but may be formed of any material having a work function lower than the first gate electrode 113 and the barrier layer 118. Therefore the overlapping region between the junction region 103 and the buried gate 16 can be sufficiently deeply formed, and GIDL can be improved.

Hereinafter, a method of fabricating a semiconductor device according to an exemplary embodiment is described with reference to FIGS. 3A to 3H.

Figure 3A:
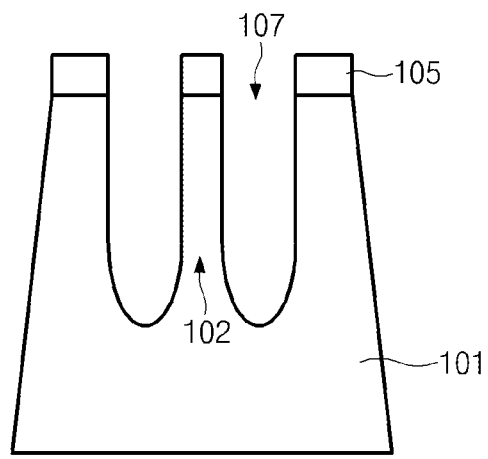
FIGS. 3A to 3H are cross-sectional views illustrating a method of fabricating a semiconductor device according to a first exemplary embodiment.

First, as shown in FIG. 3A, a hard mask layer 105 for a trench 107 is formed on a semiconductor substrate 101 in which an active region 102 is defined by a device isolation layer (not shown). The trench 107 is formed in the semiconductor substrate 101 using the hard mask layer 105 as a mask. The trench 107 may be formed to have a depth of about 1500 Å.

Figure 3B:
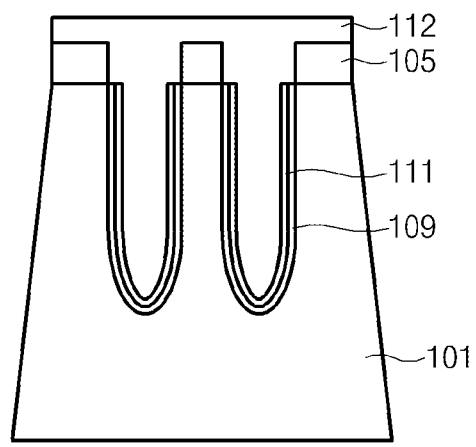

As shown in FIG. 3B a gate insulating layer 109 and a barrier metal layer 111 are sequentially deposited in the trench along a step of the hard mask layer 105 and etched back, so that the gate insulating layer 109 and the barrier metal layer 111 remain on an inner surface of the trench 107. A first gate material 112 is deposited on the barrier metal layer 111 to be filled within the trench.

Here, the gate insulating layer 109 protects a surface of the semiconductor substrate 101 comprising a silicon material. The gate insulating layer 109 is formed by depositing a high-k material such as silicon oxide (SiO$_2$), oxide-nitride-oxide (ONO), hafnium oxide (HfO$_2$), zirconium oxide (ZrO), or a lead zirconate titanate (PZT) material using a chemical vapor deposition (CVD) method or heating the semiconductor substrate using a furnace. Alternatively, the gate insulating layer 109 may be formed by depositing material such as zirconium (Zr) or hafnium (Hf) on the inner surface of the trench 107 using an atomic layer deposition (ALD) method and naturally-oxidizing the material to convert the material into a high-k material.

The barrier metal layer 111 is formed between the gate insulating layer 109 and the first gate material 112 to ensure a bonding between the gate insulating layer 109 and the first gate material 112. The first gate material 112 may comprise tungsten (W), titanium (Ti), aluminum (Al), tantalum (Ta), tungsten nitride (WNx), aluminum nitride (AlNx), titanium nitride (TiNx), tungsten silicide (WSix), titanium silicide (TiSix), cobalt silicide (CoSix), or combinations thereof.

Figure 3C:
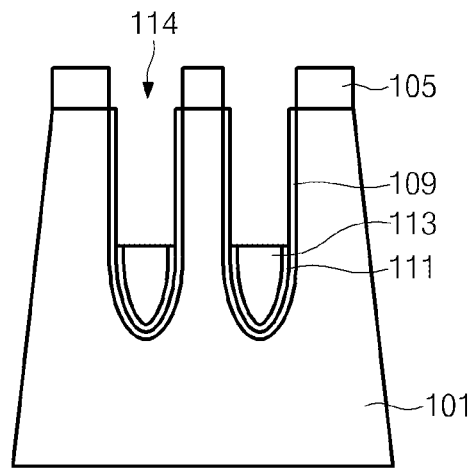

As shown in FIG. 3C the first gate material 112 is planarized, and then an etch back process is performed to partially remove the barrier metal layer 111 and the first gate material 112. Thus formed is a trench 114 in which the first gate material 112, a barrier metal layer 111, and a first gate electrode 113 are formed in a lower portion thereof and only the gate insulating layer 109 remains in an upper portion thereof. The first gate electrode 113 may have a height of about 700 Å, and the trench 114 on the first gate electrode 114 may have a height of about 800 Å.

Figure 3D:
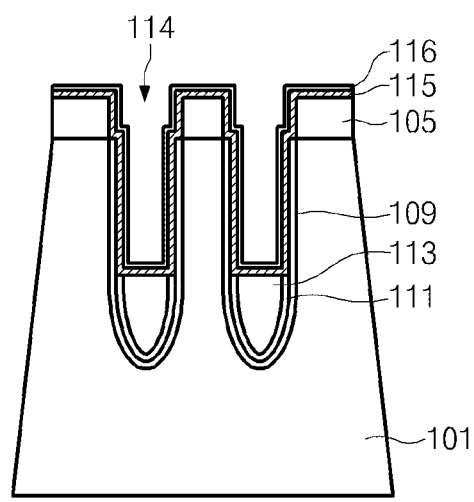

As shown in FIG. 3D, a second gate material 115 is deposited on an inner surface of the trench 114 and an entire surface of the hard mask layer 105 along a step. The second gate material 115 may include a polysilicon material doped with N+ type dopants. Next, a barrier metal layer 116 (Ti, TiN, and the like) is deposited on the second gate material 115.

Figure 3E:
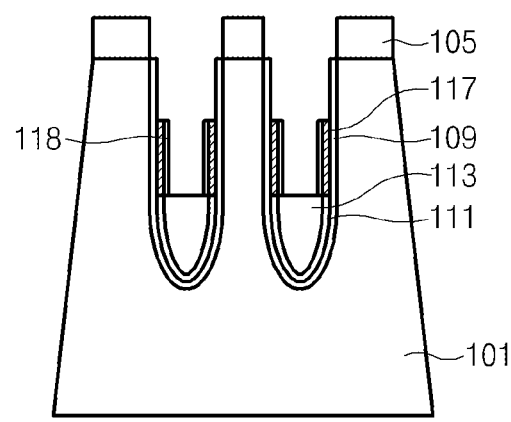

As shown in FIG. 3E, a spacer-etching process is performed to remove the second gate material 115 and the barrier metal layer 116 on a bottom and an upper inner sidewall of the trench 114 and the hard mask layer 105. Therefore, a second gate electrode 117 and a barrier layer 118 are formed on both inner sidewalls of the trench 114. The second gate electrode 117 has a height to overlap the junction regions (see 103 of FIG. 1).

FIGS. 3D and 3E illustrate a process of sequentially depositing the second gate material 115 and the barrier metal layer 116 (Ti, TiN, and the like) and etching back the gate material 115 and the barrier metal layer 116. Alternatively, the second gate material 115 is deposited and then etched back, and the barrier metal layer 116 is deposited and etched back.

Figure 3F:
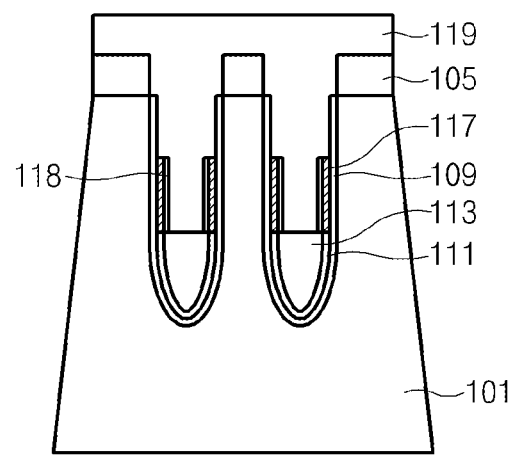

As shown in FIG. 3F a third gate material 119 is deposited on the inner surface of the trench 114 of FIG. 3E and a surface of the hard mask layer 105, and planarized. The third gate material 119 may include the same metal-based material as the first gate material 112, or may include a metal-based material different from the metal-based material for the first gate material 112. Preferably, the third gate material 119 has a work function higher than the second gate electrode 117. For example, when the first gate electrode 113 is formed of tungsten (W) and the second gate electrode 117 is formed of doped polysilicon, the third gate material 119 may be formed of tungsten (W).

Figure 3G:
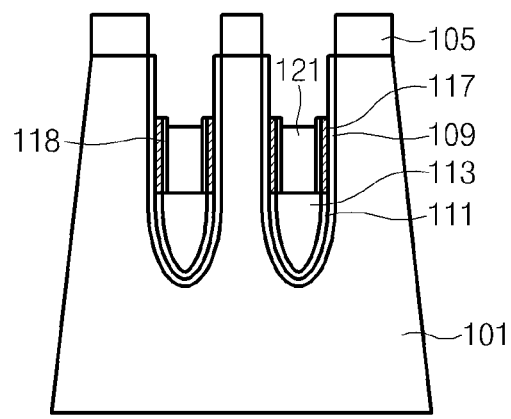

As shown in FIG. 3G, the planarized third gate material 119 is etched back to form a third gate electrode 121 between the second gate electrodes 117.

Figure 3H:
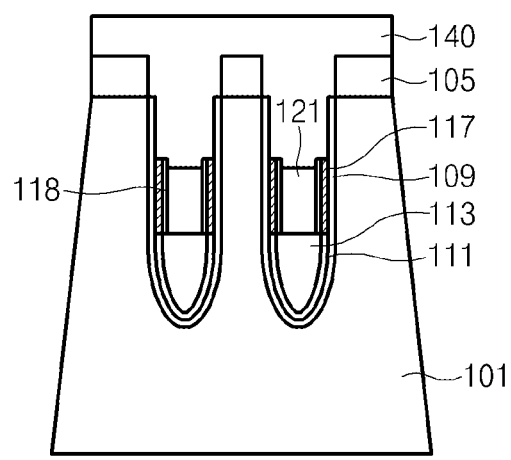

As shown in FIG. 3H, a sealing layer 140 is formed on the third gate electrode 121 and the surface of the hard mask layer 105. The sealing layer 140 may comprise a nitride layer.

Subsequently, the sealing layer 140 may be planarized. A storage node contact (not shown), a bit line contact (not shown), and the like may be formed on the sealing layer 140. Then, the junction regions 103 are formed as shown in FIG. 1.

In the buried gate of the above-described exemplary embodiment, the second gate electrodes 117 are formed in inner sidewalls of the trench using polysilicon to prevent degradation of refresh characteristic due to GIDL. Accordingly, a gate resistance is reduced and tWR characteristics are improved.

In other words, according to the present invention, the buried gate 16 includes a lower gate structure and an upper gate structure. The lower gate structure includes the first gate electrode 113 and does not overlap with any of the junction regions 103. The upper gate structure includes the second the third gate electrodes 117, 121 and overlaps with any of the junction regions 103.

Compared to a conventional device where a space between the junction region 103 and over the lower gate structure is filled with an insulating material, the present invention where the space between the junction region 103 is filled with the upper gate structure having a work function lower than the insulating material is advantageous in lowering resistance between the buried gate 16 and the junction regions 103 and improving tWR characteristics.

Figure 4:
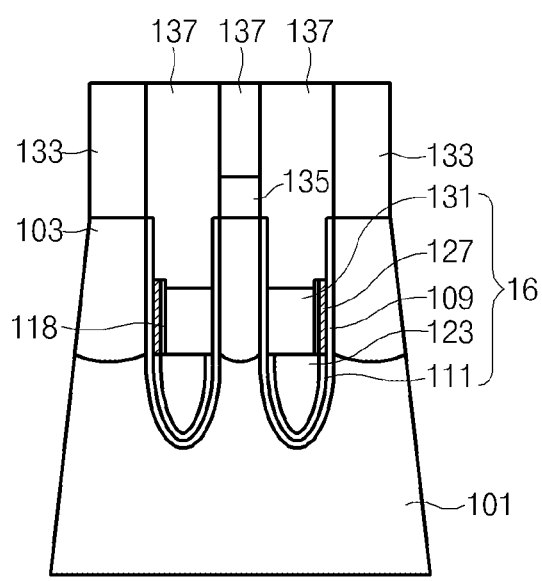
FIG. 4 is a cross-sectional view illustrating a semiconductor device according to a second exemplary embodiment of the inventive concept taken along line A-A' of FIG. 1.

FIG. 4 is a cross-sectional view of a semiconductor device according to a second exemplary embodiment of the inventive concept taken along A-A' of FIG. 1.

As shown in FIG. 4, a semiconductor device according to the second exemplary embodiment includes a buried gate 16 in a semiconductor substrate 101. The buried gate 16 includes a gate insulating layer 109 and a barrier metal layer 111 sequentially stacked on an inner surface of a trench, a first gate electrode 123 formed on the barrier metal layer 111, a second gate electrode 127 on one sidewall of the trench on the first gate electrode 123, and a third gate electrode 131 formed on one side of the second gate electrode 127 on the first gate electrode 123.

Here the second gate electrode 127 is formed on the one sidewall of the trench adjacent to a storage node contact 133, and the third gate electrode 131 is formed on the other sidewall of the trench adjacent to a bit line contact 135. A nitride layer 137 is formed between the storage node contact 133 and the bit line contact 135.

The first gate electrode 123 has a height not to overlap a junction region 103. The second gate electrode 127 has a height to overlap the junction region 103.

A barrier layer 118 is formed between the second gate 127 and the third gate electrode 131 to reduce a contact resistance between the second gate electrode 127 and the third gate electrode 131. The barrier layer 118 may comprise Ti, TiN, and or the like.

The first gate electrode 123 and the third gate electrode 131 may comprise a metal material such as tungsten (W). The second gate electrode 127 adjacent to the junction region 103 may comprise doped polysilicon, e.g., an N+ polysilicon material.

In the above-described second exemplary embodiment, the buried gate has a structure such that the N+ polysilicon gate electrode (second gate electrode) having a work function lower than the first gate electrode 113, is applied to an overlapping region with the junction region 103 adjacent to the storage node contact 133 to form the overlapping region between the junction regions 103 to improve GIDL. Hereinafter, a method of fabricating a semiconductor device according to the second exemplary embodiment will be described with reference to FIGS. 5A to 5E.

First, as shown previously in FIGS. 3A to 3E, a first gate insulating layer 109, a barrier metal layer 111, and a first gate electrode 113 are formed in a lower portion of a trench 114 in a semiconductor substrate 101. Then, a second gate material 115 is deposited on an inner surface of the trench 114 and an entire surface of a hard mask layer 105 along a step. The second gate material 115 may include a polysilicon material doped with an N+ type ion. Next a barrier metal (Ti, TiN, and the like) 116 is deposited on the second gate material 115 and then spacer-etched, so that the second gate material 115 and the barrier metal layer 116 remain on both sidewalls of the trench.

Figure 5A:
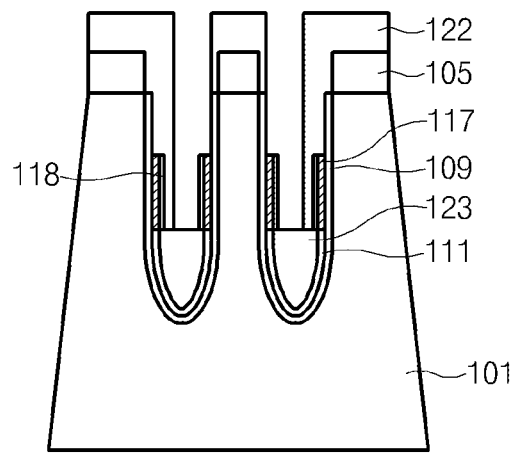
FIGS. 5A to 5E are cross-sectional views illustrating a method of fabricating a semiconductor device according to a second exemplary embodiment.

As shown in FIG. 5A, a photoresist layer 122 is formed to cover the second gate material 115 and the barrier metal 116 at a storage node contact (not shown) side, and expose the second gate material 115 and the barrier metal layer at a bit line contact 116 (not shown) side.

Figure 5B:
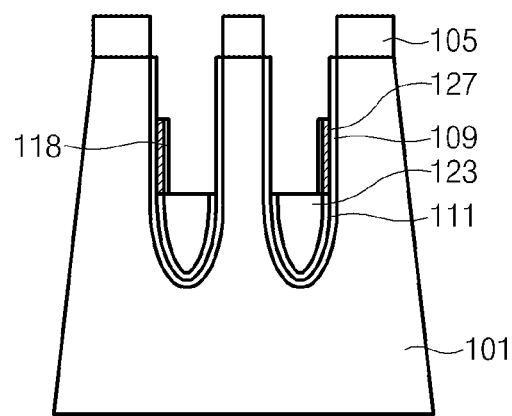

As shown in FIG. 5B, an etch back process is performed using the photoresist layer 122 to form a second gate electrode 127 and a barrier layer 118 which are the second gate material 115 and the barrier metal 116 remaining on one sidewall of the trench. The second gate electrode 127 and the barrier layer 118 are formed on the one sidewall of the trench 114 at the storage node contact (not shown) side. The second gate electrode 127 and the barrier layer 118 have a height to overlap the junction region.

Figure 5C:
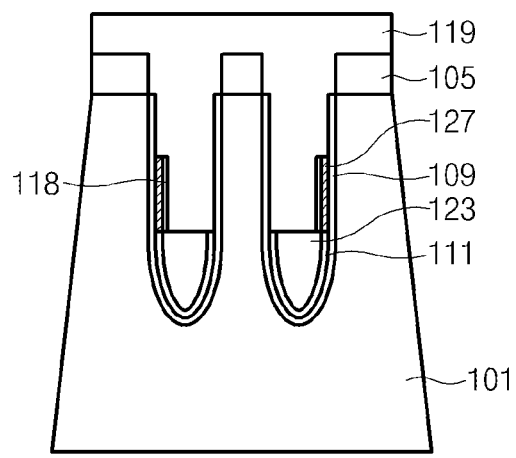

As shown in FIG. 5C, a third gate material 119 is deposited on the second gate electrode 127 and the barrier layer 118. The second gate material 119 may include the same metal-based material as the first gate material.

Figure 5D:
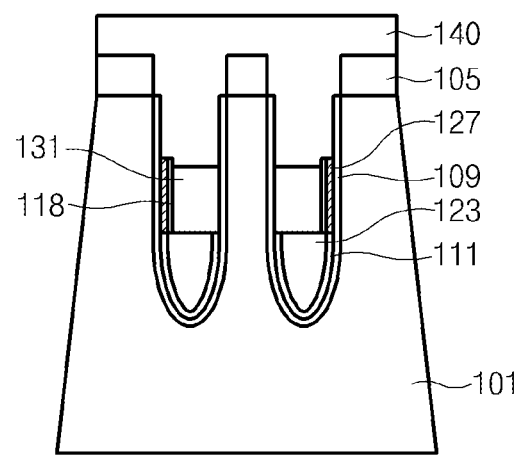

As shown in FIG. 5D, the third gate material 119 is planarized and then etched back to form a third gate electrode 131. The third gate electrode 131 may be formed to have the same height as the second gate electrode 127, or to have a height smaller than the second gate electrode 127. A sealing layer 140 is formed on the second gate electrode 127 and the third gate electrode 131.

Figure 5E:
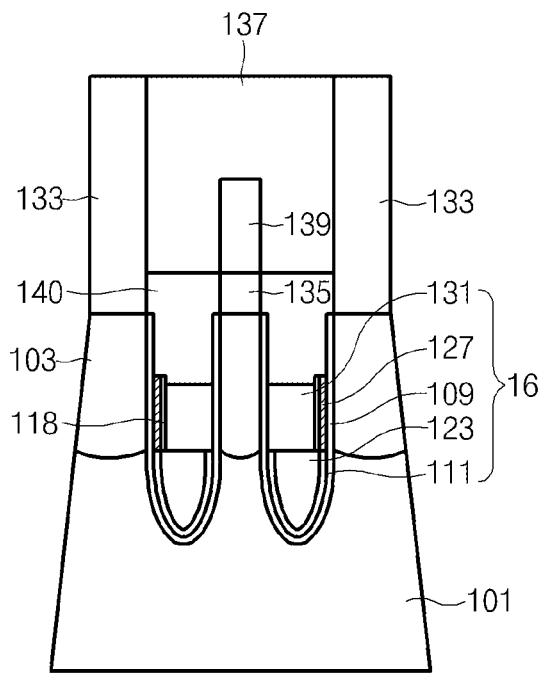

As shown in FIG. 5E, the sealing layer 140 is planarized. A bit line contact 135 is formed on the substrate 101 at one side of the buried gates 16. A bit line 139 is formed on the bit line contact 135, and a storage node contact 133 is formed on the substrate 101 at the other side of the buried gate 16. When the storage node contact 133 is formed, a junction region 103 is formed on the substrate 101. A nitride layer 137 is formed between the bit line contact 135 and the storage node contact 133 and on the bit line 139. The junction region 103, the bit line contact 135, storage node contact 133, and the bit line may be formed in the usual process.

In the buried gate according to an exemplary embodiment, the N+ polysilicon gate (second gate electrode) is formed between the third gate electrode 131 and the junction region 103 which is coupled to the storage node contact 133.

In the second exemplary embodiment described above the buried gate has (i) a lower gate structure including a metal gate electrode (the first gate electrode) and (ii) an upper gate structure including the third gate electrode each having low work function values. The upper gate structure further includes the N+ polysilicon gate electrode (the second gate electrode) between the third gate electrode and the junction region 103. Therefore, resistance in the overlapping region between the junction region 103 and the buried gate 16, more specifically the upper gate structure, becomes low and thus tWR characteristics can be improved.

The above embodiments are illustrative and not limitative. Various alternatives and equivalents are possible. Embodiments are not limited to any specific type of semiconductor device. Other additions, subtractions, or modifications may fall within the scope of the appended claims.

What is claimed is:

1. A method of fabricating a semiconductor device, the method comprising:
   etching a gate region of a semiconductor substrate to form a trench;
   forming a first gate material layer filling the trench;
   etching the first gate material layer, to form a first gate electrode, to a depth at which the first gate electrode does not overlap with junction regions of the semiconductor substrate;
   forming a second gate electrode over at least one inner sidewall of the trench and over the first gate electrode; and
   forming a third gate electrode in the trench over one side of the second gate electrode and over the first gate electrode,
   wherein the second gate electrode is electrically coupled to the first gate electrode.

2. The method of claim 1, wherein the at least one inner sidewall of the trench includes first and second inner sidewalls, and
   wherein the forming the second gate electrode includes forming the second gate electrode over the first and second inner sidewalls of the trench adjacent to the junction regions and over the first gate electrode.

3. The method of claim 1, wherein the forming the second gate electrode includes forming the second gate electrode over the one inner sidewall of the trench adjacent to a storage node contact.

4. The method of claim 1, wherein the forming the second gate electrode includes forming the second gate electrode to have a height to overlap the junction regions.

5. The method of claim 1, wherein the etching the first gate material layer includes:
   etching the first gate material layer such that an upper surface of the first gate electrode does not overlap with the junction regions.

6. The method of claim 1, the method further comprising:
   forming a barrier layer over the one side of the second gate electrode before the forming the third gate electrode.

7. The method of claim 6, wherein the barrier layer is formed using at least one of titanium (Ti) and titanium nitride (TiN).

8. The method of claim 1, the method further comprising:
   forming a gate insulating layer along a contour of the trench before forming the first gate material layer.

9. The method of claim 8, wherein the forming the first gate material layer includes:
   forming a barrier metal layer over the gate insulating layer in the trench; and
   depositing a first gate material over the barrier metal layer to form the first gate material layer.

10. The method of claim 9, wherein the etching the first gate material layer includes:
    partially etching the first gate material layer and simultaneously partially etching the barrier metal layer.

11. The method of claim 1, wherein the first gate electrode and the third gate electrode are formed of a metal material and the second gate electrode is formed of a polysilicon material.

12. The method of claim 1, wherein the at least one inner sidewall of the trench includes first and second inner sidewalls, and
wherein the forming the second gate electrode includes:
depositing a second gate material along a contour of the trench;
performing spacer-etching on the second gate material to remain over the first and second inner sidewalls of the trench; and
etching the second gate material remaining over the both sidewalls of the trench to a fixed height, to form the second gate electrode.

13. The method of claim 1, wherein the at least one inner sidewall of the trench includes first and second inner sidewalls, and
wherein the forming the second gate electrode includes:
depositing a second gate material along a contour of the trench;
etching the second gate material through spacer-etching to remain over the first and second inner sidewalls of the trench;
etching remaining second gate material over the both sidewalls of the trench to a fixed height;
forming a photoresist layer covering the second gate material at a storage node contact side; and
removing the second gate material formed over another sidewall of the trench and exposed by the photoresist layer.

14. The method of claim 1, wherein the first gate electrode is electrically coupled to the third gate electrode.

* * * * *